(12) United States Patent
Kim

(10) Patent No.: US 7,209,384 B1
(45) Date of Patent: Apr. 24, 2007

(54) PLANAR CAPACITOR MEMORY CELL AND ITS APPLICATIONS

(76) Inventor: Juhan Kim, 5890 W. Walbrook Dr., San Jose, CA (US) 95129

( * ) Notice: Subject to any disclaimer, the term of this patent is extended or adjusted under 35 U.S.C. 154(b) by 0 days.

(21) Appl. No.: 11/164,872

(22) Filed: Dec. 8, 2005

(51) Int. Cl.
*G11C 11/36* (2006.01)
(52) U.S. Cl. .................................... 365/175; 365/105
(58) Field of Classification Search ................ 365/175, 365/105, 187, 149
See application file for complete search history.

(56) References Cited

U.S. PATENT DOCUMENTS

| | | | |
|---|---|---|---|
| 5,691,935 A * | 11/1997 | Douglass ..................... | 365/149 |
| 5,757,693 A * | 5/1998 | Houghton et al. .......... | 365/149 |
| 5,909,400 A * | 6/1999 | Bertin et al. ................ | 365/187 |
| 6,104,045 A | 8/2000 | Forbes et al. | |
| 6,229,161 B1 | 5/2001 | Nemati et al. | |
| 6,442,065 B1* | 8/2002 | Hofmann et al. ........... | 365/175 |
| 6,492,662 B2 | 12/2002 | Hsu et al. | |
| 6,773,968 B1 | 8/2004 | Forbes et al. | |
| 6,838,723 B2 | 1/2005 | Forbes | |
| 6,943,083 B2 | 9/2005 | Forbes | |
| 6,967,358 B2 | 11/2005 | Nemati et al. | |
| 7,078,739 B1 | 7/2006 | Nemati et al. | |
| 2003/0048655 A1* | 3/2003 | El-Sharawy et al. ........ | 365/149 |

OTHER PUBLICATIONS

"A novel capacitor-less DRAM cell Thin Capacitively-Coupled Thyristor (TCCT)", 2005 IEEE Electron Devices Meeting (IEDM) Tech. Dig. pp. 311.
WO/2005/114742 Silicon on Insulator Read-Write Non-Volatile Memory Comprising Lateral Thyristor and Trapping Layer.

* cited by examiner

*Primary Examiner*—Anh Phung

(57) ABSTRACT

A capacitor memory is realized, wherein a capacitor stores data and a diode controls to store data "1" or "0". Diode has four terminals wherein first terminal serves as word line, second terminal serves as storage node, third terminal is floating, and fourth terminal serves as bit line, wherein back channel effect is suppressed adding additional ions in the bottom side of third terminal or applying negative voltage in the well or substrate. A capacitor plate couples to second terminal, which plate has no coupling region to first, third and fourth terminal. With no coupling, the inversion layer of plate in the storage node is isolated from the adjacent nodes. In doing so, the plate can swing ground level to positive supply level to write. As a result, no negative generator is required for controlling plate. Word line and bit line keep ground level during standby, and rise to supply level for read or write operation. In this manner, no holding current is required during standby, and operating current is dramatically reduced with no negative generator. Write has a sequence to clear the state of cell before writing to store data regardless of previous state. Refresh cycle is periodically asserted to sustain data. The present invention can be applied for destructive read, or for nondestructive read adding pull-down device to bit line. The height of cell is almost same as control circuit on the bulk or SOI wafer.

6 Claims, 8 Drawing Sheets

PLANAR CAPACITOR MEMORY CELL AND ITS APPLICATIONS

FIELD OF THE INVENTION

The present invention relates generally to integrated circuits and in particular to a random access memory.

BACKGROUND OF THE INVENTION

An essential semiconductor device is semiconductor memory, such as a random access memory (RAM) device. A random access memory device allows the user to execute both read and write operations on its memory cells. Typical examples of RAM devices include dynamic random access memory (DRAM), static random access memory (SRAM), and cache memory.

DRAM is a specific category of RAM containing an array of individual memory cells, where each cell includes a capacitor for holding a charge and a transistor for accessing the charge held in the capacitor. The transistor is often referred to as the access transistor or the transfer device of the DRAM cell.

FIG. 1 illustrates a portion of a DRAM memory circuit containing a DRAM cell as a prior art. DRAM cell contains a storage capacitor 114 and an access field effect transistor or transfer device 111. One side of the storage capacitor 114 is connected to a reference voltage 116. The other side of the storage capacitor 114 is connected to the drain of the transfer device. The gate of the transfer device is connected to a signal known in the art as a word line 112. The source of the transfer device is connected to a signal known in the art as a bit line 113. With the memory cell components connected in this manner, it is apparent that the word line 112 controls access to the storage capacitor 114 by allowing or preventing the signal (representing data "1" or data "0") carried on the bit line 113 to be written to or read from the storage capacitor 114. Thus, DRAM cell contains one bit of data (i.e., data "1" or data "0"). In these days, DRAM has progressed its miniaturization and as a result there arises difficulties in obtaining necessary capacitance, in decreasing leakage current at turn-off of access transistor, and in holding data charge. Moreover, many supply voltages are required for controlling DRAM cell, such as the reference voltage of storage capacitor 116 is usually connected to half VDD where VDD is high level of memory array, which half VDD is internally generated. The pre-charge level of bit line is half VDD. High level of word line is VPP which is higher than VDD, and internally generated in most applications. The body of transfer gate 115 has VBB which is negative and internally generated. Internal voltage generators need more debugging, optimizing. And those generators consume more power and increase die area.

In FIG. 2, one of the prior art, "High density planar SRAM cell using bipolar latch-up and gated diode breakdown", U.S. Pat. No. 6,104,045 is illustrated. It involves the interconnection of two memory cells so that they share a common p-n-p emitter. Each bipolar transistor device 221 and 221' comprise two complementary bipolar transistor 222 and 222' connected with base 224 and 224' to form gated diode 223 and 223'. Row address line 230 is connected to the emitters of transistor 222 and 222', respectively, while column address line 232 and 232' are connected to the emitters of transistor 221 and 221'. Write row address line 231 is connected to the gate 226 and 226' of the gated diode 223 and 223'.

To write data "0", that is, turn-off diode, word line and bit line have same voltage which makes turn-off diode. It sustains turn-off state of diode 221 in FIG. 2 by introducing a pulsed gate bias, which couples the base 224 of transistor 221, and the base 225 of transistor 222. As the base 224 goes up, the diode 221 turns off because the voltage is less than forward bias between column line 232 and the base 224, while the base 225 turns on transistor 222. The turn-off state is sustained by the base 224 when pulse moves from ground to high level.

To write data "1", that is, turn-on diode, an external stimulus such as a base current must be induced by avalanche multiplication. Base current can be generated by introducing a pulsed gate bias and higher base voltage that initiates current multiplication in the gated diode when word line 230 is at ground level and bit line 232 is at high level. The pulse level must be calculated to yield sufficient current so that the sum of the common base current gains, $\alpha_1$ and $\alpha_2$, of bipolar transistors 221, 221', 222 and 222' exceeds one. The bias applied to induce latch-up is "pulsed" in the sense that it is only applied to initiate latch-up. As shown in FIG. 3, the cell is stable in the latched-up condition as a result of the pulse-initiated latch-up, which occurs during write operation to store data "1". In order to sustain latched data "1" during standby, holding current is supplied, which is less than that of active mode in FIG. 3. Disadvantages are that the holding current is too high for all memory cells even though each memory cell has very little current, and relatively high voltage is required to make avalanche multiplication.

In FIG. 4, another prior art of memory cell is illustrated, that is U.S. Pat. No. 6,229,161 "Semiconductor capacitively-coupled negative differential resistance device and its applications in high-density high-speed memories and in power switches". This is directed to a negative differential resistance device that uses a capacitively-coupled gate adjacent to the negative differential resistance device. The cell consists of two elements: a negative differential resistance device 430 and an NMOS access transistor 434 as shown in FIG. 4. The access transistor 434 includes a gate 436 that forms part of a first word line and n+ drain and source regions, with one of the n+ drain and source regions connected to a bit line 441. The device 430 has a middle p-region adjacent to a charge plate, or gate-like device 435. The charge plate 435 forms part of a second word line and is used to enhance switching between the cell's two stable states: the off state, where the device 430 is in a current-blocking mode; and the on state, where the device 430 is in a current-passing mode. The voltage of the storage node 439 is at its high value for the on state, and the holding current of the negative differential resistance device 430 is provided by the subthreshold current of the access transistor 434. The speed of negative differential resistance based memory achieved about 2 ns to 5 ns, as published.

One of disadvantage is that the charge plate 435 should be negative bias voltage during standby. Second word line 437 has very high switching current, which signal stays at negative level to store data during standby, then moves from negative to high level to write cells, and consequently consumes high power with internal negative voltage generator. Moreover, this prior part of memory cell in FIG. 4 has one more disadvantage to sustain latched-up data by sub-threshold current, if holding current is higher than sub-threshold current, memory cell loses data. In FIG. 5 the current-voltage curve is illustrated. This prior art of memory cell is refreshed by periodic accessing with short pulse which is described in "Fully planar 0.562/spl mu/n/sup 2/T-RAM cell in a 130 nm SOI CMOS logic technology for high-density high-performance SRAMs", IEDM 2004, but periodic accessing needs switching current and more control circuits.

In FIG. 6 one more prior art illustrates "Merged MOS-bipolar capacitor gain cell", U.S. Pat. Nos. 6,940,761, 6,943,083. Read word line 652 is connected to gate 653. The write word line 657 is operable to bias the base region function of the bipolar device of the merged MOS-bipolar structure. Thus, as shown in FIG. 6, the merged device consists of a MOS (Metal-Oxide Semiconductor) transistor-bipolar transistor-storage capacitor. The sense device used to read the cell is the PMOS transistor 653 which is addressed by the read word line 652.

In operation, if negative charge or electrons are stored on the body 654, then the body will be slightly forward biased and the PMOS transistor 653 will be more conductive than normal. Charge is injected on to the floating body 654 of the PMOS transistor 653 by the n-p-n vertical bipolar transistor 658. Forward bias can be achieved by driving the emitter/sourceline 659 negative and by driving the write data word line 657, connected to the base/source region 660, positive to achieve a coincident address at one location. The cell can be erased by driving the drain 651 positive and by driving the gate 652 negative to forward bias the drain-body p-n junction. However, this prior art of cell needs complexity of operation using negative voltage, and needs MOS device to read which is more complicated to shrink.

And other prior arts are published as follows, Tanaka et al, "Scalability study on a capacitorless 1T-DRAM: from single-gate PD-SOI to double-gate FinDRAM", Electron Devices Meeting, 2004 IEDM Technical Digest. December 2004, and Shino et al, "Operation voltage dependence of memory cell characteristics in fully depleted floating-body cell", IEEE Transactions on Electron Devices, vol. 52, No. 10, pp 2220–2226, October 2005. These types of memories are so-called, "gain-cell", or "floating-body cell". However, these cells need negative voltage for read and write operations, and write time is relatively slow to generate ions by impact ionization, which takes 5 ns to 10 ns, as published.

Still, there is a need in the art for a memory circuit and cell for random access memory devices, which realize low power, high density and simple structure to fabricate on the wafer. In the conventional MOS access transistor as shown in FIG. 1, there is a parasitic n-p-n bipolar transistor wherein the body 115 serves as the base, source/drain serve as the emitter/collector. During read and write cycle, the base (body) 115 is at ground (or negative) to prevent bipolar effect. The parasitic bipolar transistor is not wanted device in the conventional memories which is usually turned off, but now adding one more terminal to the parasitic bipolar transistor in the conventional memory, a p-n-p-n diode (or n-p-n-p) can serve as four-terminal diode access device for the next generation memory devices with good performance and simple structure. Separately, storage element is required to store data such as a capacitor for the capacitor memory, but there is no need of high capacitance because the storage capacitor only drives the base of bipolar transistor while strong diode drives heavy bit line.

SUMMARY OF THE INVENTION

In the present invention, a planar capacitor memory cell and its applications are described. The memory cell includes a capacitor and a diode which are less complicated to fabricate, and does not need complex MOS access device. Capacitor includes silicon dioxide or high dielectric insulator, and plate of capacitor couples to storage node which has no coupling region to other nodes. In doing so, plate can swing ground to supply level to write data. Diode has four terminals where first terminal serves as word line, second terminal is storage node, third terminal is floating and fourth terminal serves as bit line. Diode need not be a high performance device nor have a high current gain. After storing data, diode is turned-off to cut off standby current. As a result, the present invention has many advantages as follows.

The memory does not use negative voltage for switching. Single or dual positive voltage can operate all the memory arrays. And memory cell does not need holding current to sustain data. In this manner, very low power consumption is realized.

The memory has long retention time. Low power consumption suppresses temperature, which can reduce junction leakage and capacitor oxide leakage. It is very helpful to store data for a long time in the storage node with low leakage, which can increase memory yield. And there is no need of big capacitor because the storage capacitor drives the base of bipolar transistor to read the stored data instead of heavily loaded bit line, while the diode drives heavily loaded bit line directly. Capacitor oxide leakage is minimized with low leakage material or thick oxide. One more leakage path is through third terminal, which forms a parasitic MOS transistor such that substrate serves as a gate, third terminal serves as a body, second terminal which is storage node serves as source or drain, and fourth terminal serves as drain or source. It is so-called back channel effect on SOI (Silicon-on Insulator) type planar device. This path can be carefully controlled by adding majority carrier into third terminal, or applying negative voltage to the substrate, where negative voltage generator has very low power consumption because it compensates insulator leakage, not switching current. And leakage of storage node through reverse bias can be reduced with low concentration doping to form diode while MOS transistor needs high doping drain and source. In this manner, all leakage paths can be reduced.

The present invention of memory can be implemented on the bulk or SOI wafer with almost same height of the control circuit, which makes to integrate high density memory and control circuit on a single chip with no extra flattening process. The memory cell is horizontally formed to reduce additional process steps while vertical structures need more steps to form additional layers from the standard CMOS process.

Various types of diode can be applied to form the memory cell, such as silicon, germanium, GaAs, SiGe, and metal semiconductor diode, as long as the reverse bias current is controllable.

The memory operation is very fast and stable. Diode output can be transferred to latch device quickly, because diode current is generally much higher than that of MOS transistor. Furthermore, the diode also serves as a sense amplifier such that the diode generates binary value "on" or "off", whether the storage node (the second terminal) is forward-bias or not, comparing to the voltage of the word line. Thus, diode can replace sense amplifier. And non destructive read is realized by sustaining the current path with NMOS pull-down, which need not restoring procedure and makes to reduce cycle time. However, in some applications, destructive read is still useful to make compatibility with conventional DRAM, which does not need to sustain the current path with NMOS pull-down when reading, but needs restoring procedure for each read. Write operation has a sequence to clear data, that is, to turn-on diode before writing, which makes storage node to have the same starting voltage when writing. Without this sequence, the stored level depends on the previous level which can be discharged after restored.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

Figure 1:
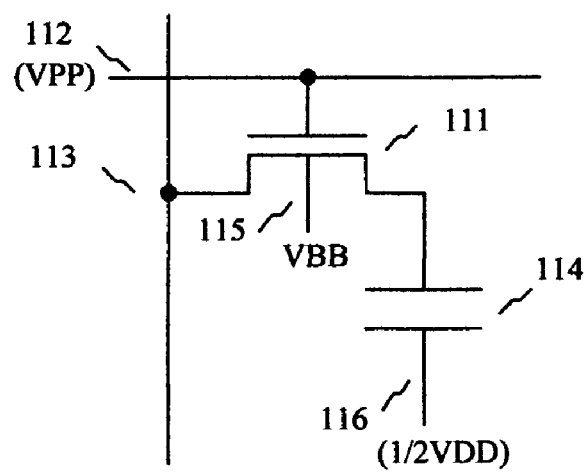
FIG. 1 is a circuit diagram illustrating conventional dynamic random access memory (DRAM) cells as a prior art.
Figure 2:
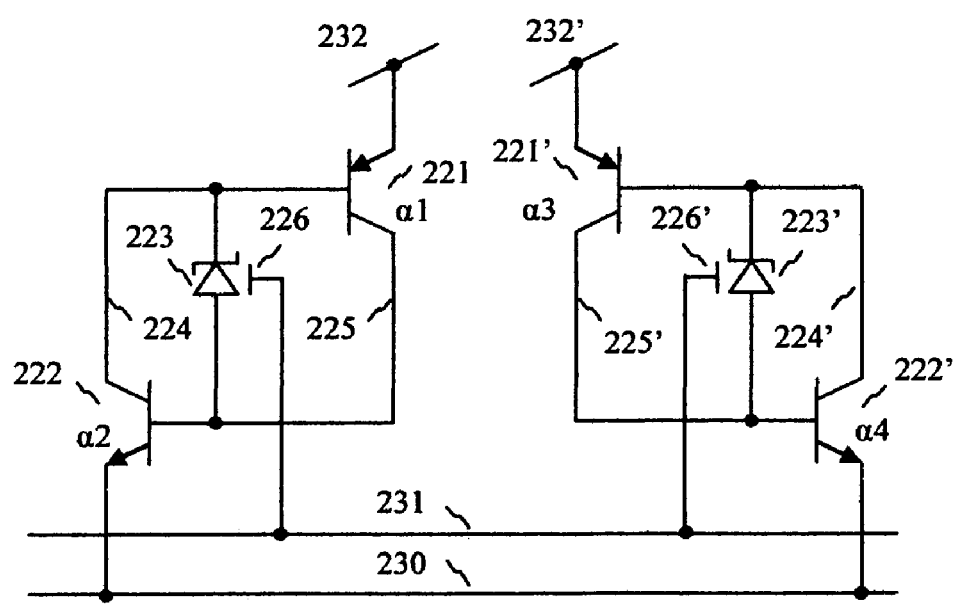
FIG. 2 is one of the prior art, "High density planar SRAM cell using bipolar latch-up and gated diode breakdown".
Figure 3:
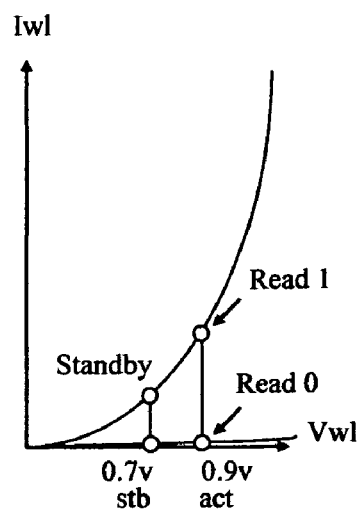
FIG. 3 is current-voltage curve of the prior art in FIG. 2.
Figure 4:
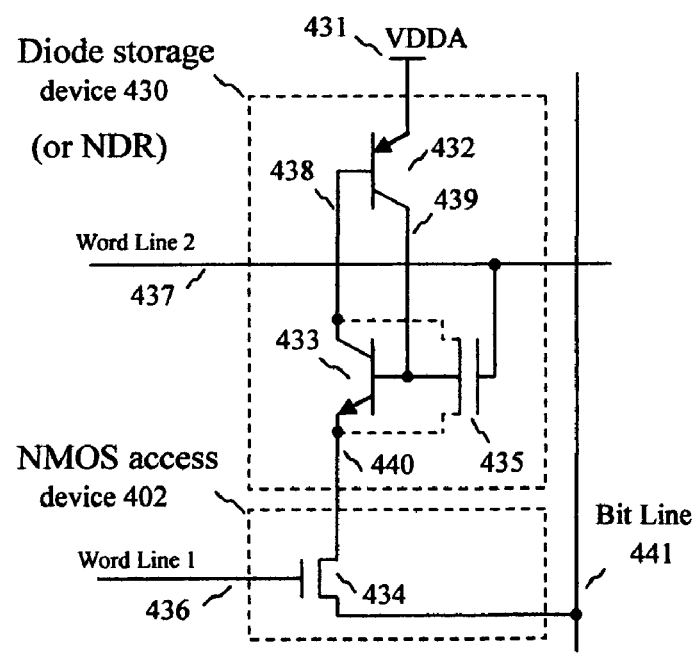
FIG. 4 is one of the prior art, "Semiconductor capacitively-coupled NDR device and its applications in high-density high-speed memories and in power switches".
Figure 5:
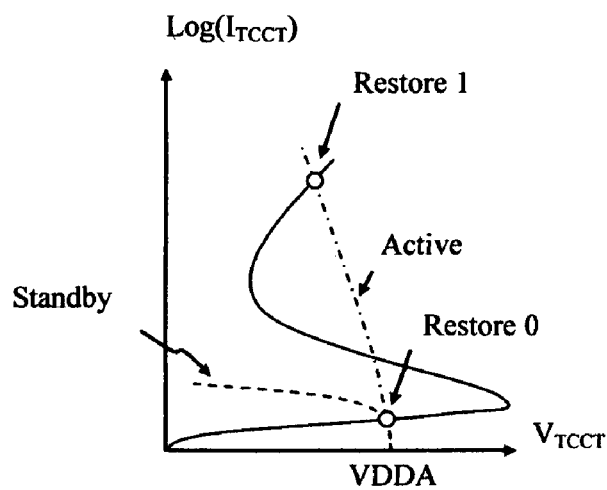
FIG. 5 is current-voltage curve of the prior art in FIG. 4.
Figure 6:
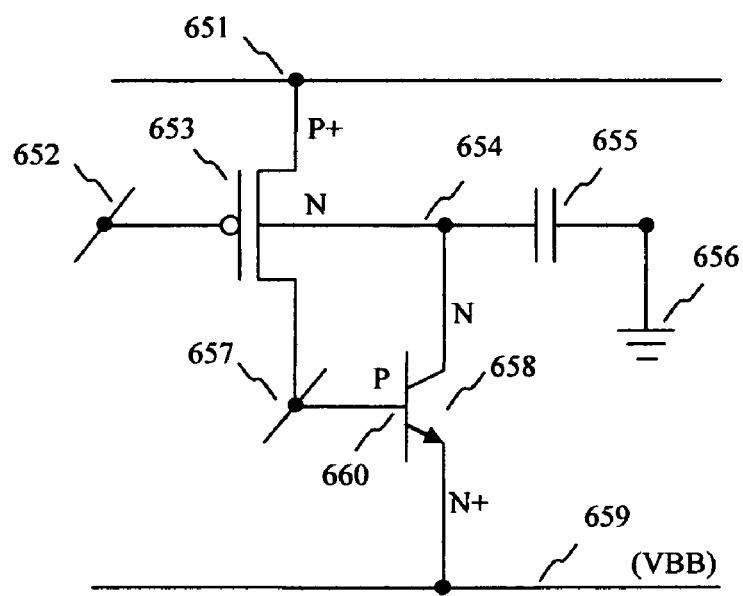
FIG. 6 is one of the prior art, "Merged MOS-bipolar capacitor memory cell".
Figure 7:
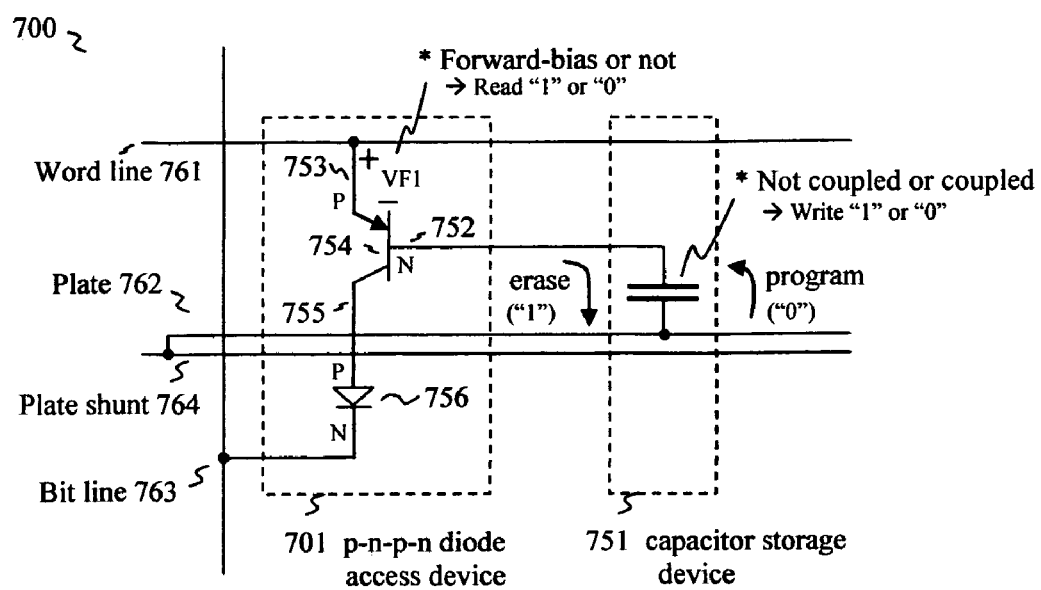
FIG. 7 is the present invention of the random access memory.
Figures 11A, 11B:
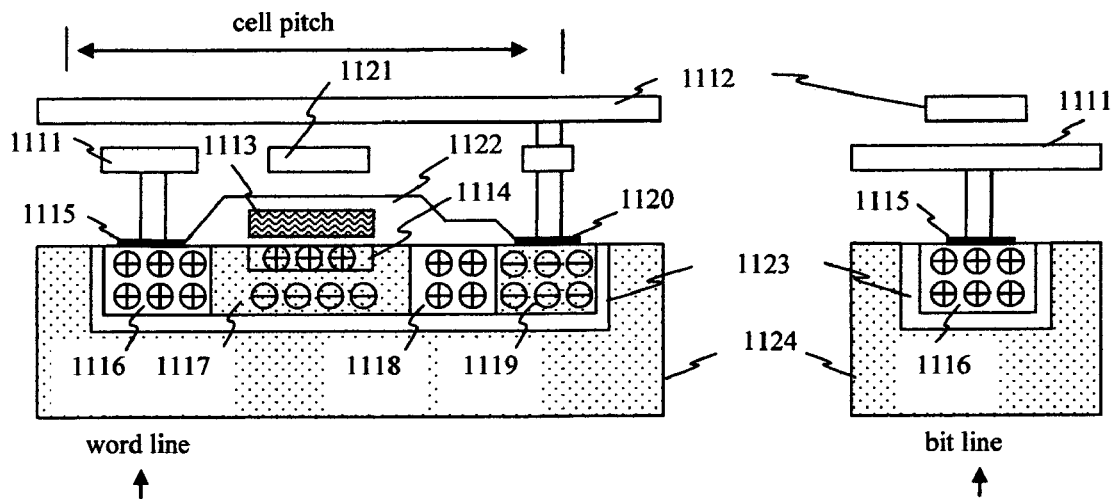
FIGS. 11a and 11b illustrate one embodiment for forming a memory cell on the bulk of the wafer for the present invention. 11a is shown from the word line direction, and 11b is shown from the bit line direction.

The present invention is directed to random access memory, which stores data in a storage capacitor. In FIG. 7, the present invention of memory cell 700 is shown. The plate 762 only couples to base 752 which forms a storage capacitor 751, wherein the plate shunt 764 is added to reduce resistance of the plate 762. Generally, four-terminal diode (p-n-p-n diode, known as Shockley diode) is described as a p-n-p transistor and an n-p-n transistor which form a feedback loop. Once turned on, p-n-p-n diode will remain on conducting state with the feedback loop, as long as there is a significant current flowing through it. However, in the capacitor memory applications, one of two transistors is simplified as a p-n diode to remove feedback loop because the storage capacitor effectively controls the base of p-n-p transistor with the stored charge, while there is no storage capacitor in the base of n-p-n transistor. Hence, n-p-n transistor is replaced with a p-n junction. If storage node (752) voltage is lower than word line (761) voltage minus built-in voltage (VF1 in FIG. 7), the current path is set up when word line is asserted. Once it is turned on, the current path will remain with the charge of the storage node 752, which is read "1". If storage node (752) voltage is higher than word line voltage, the diode is turned off, which is read "0". After read data from the storage node, the potential of storage node is not changed. In this manner, nondestructive read is realized, and p-n-p-n diode detects whether the storage node 752 is forward-bias or not compared to word line. As a result, the diode serves as sense amplifier, which generates binary value, "on" or "off". This equivalent circuit is very useful to analyze the memory operations with no feedback loop. As shown in FIG. 7, the p-n-p-n diode access device 701 includes a p-n-p transistor 754 and a p-n diode 756, such that the first terminal 753 is connected to word line 761 to activate the memory cell, the second terminal 752 serves as a storage node and connected to the one side of the storage capacitor 751 in order to store data. And the third terminal 755 is floating, thus the third terminal does not store data because it has no storage capacitor and it is discharged by the forward-bias toward bit line 763 during standby, and it is turned on only if p-n-p transistor provides the current from the word line when activated. But the third terminal 755 has important role in order to protect the storage node 752 when unselected with reverse-bias. And the fourth terminal is connected to bit line 763 in order to read and write data. In addition, the plate 762 couples only the storage node 752 to store data, which means that there is no overlapping region to the first terminal 753 and the third terminal 755 with the plate 762. It is important to separate the inversion layer between the plate 762 and the storage node 752 from the adjacent nodes, in order to raise the storage node (second terminal) higher than word line voltage by the plate coupling, when writing data "0". Otherwise, the plate coupling can not raise the storage node higher than word line voltage if the inversion layer is close to the adjacent nodes, which results in the leakage of the stored charge. With no leakage to the adjacent nodes, the plate 762 can swing from the ground level to predetermined positive level to write data with separating inversion layer. Thus there is no need of negative voltage to write data, as long as the inversion layer of the storage node is far enough from the adjacent nodes (as shown in FIG. 11a), which realizes to design the memory with single or dual positive voltage. In write operation, the storage node 752 is erased by lowering the plate 762 when word line is asserted to high level, which means that the diode is turned on by lowering the plate 762 and the potential of the storage node is lower than the word line. When the storage node is reached below built-in voltage of the word line, p-n-p transistor 754 is turned on, which pulls up the anode of the p-n diode 756. This is called "erase", because all the memory cells on the same row are erased. After then, only selected cells are 'programmed' by coupling, which is write "0" operation to store high voltage in the storage node. The other cells are sustaining the turn-on state of the diode. Thus the storage node 752 will not be coupled by raising the plate 762 because the current flow is stronger than the capacitive coupling, which is write "1" operation. More detailed operations will be explained as below.

Figure 8:
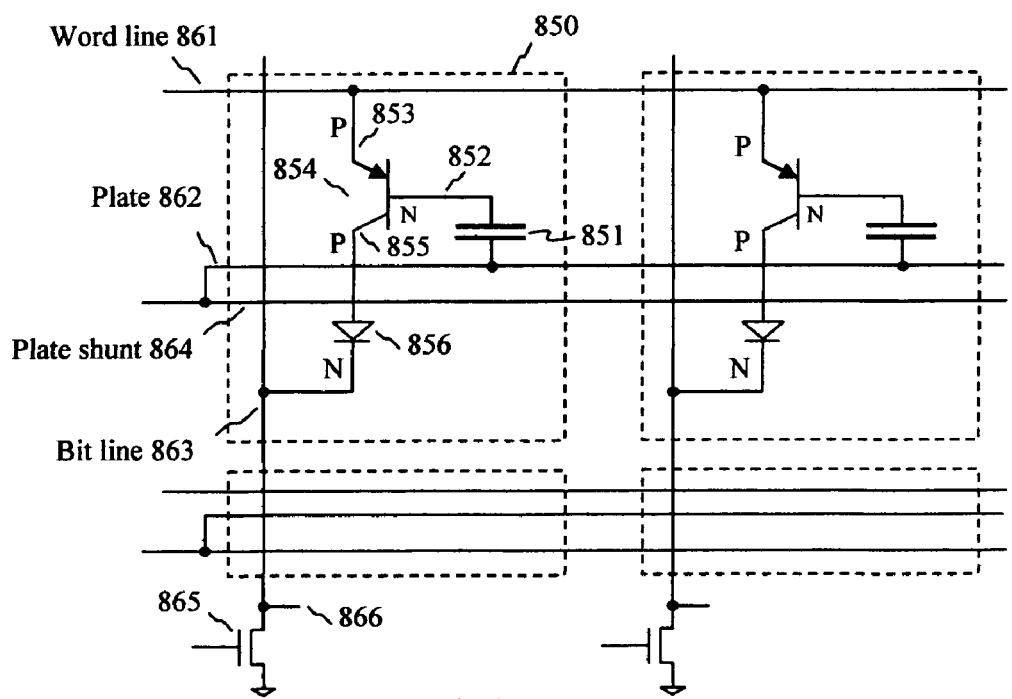
FIG. 8 is an example of the memory array of the present invention.

In FIG. 8, an example of the memory array with diode access device is shown. Capacitor 851 is connected to the storage node 852 which serves as the base of p-n-p transistor 854, plate of capacitor 862 has shunting line 864 which has low sheet resistance, and p-n-p transistor 854 consists of the emitter 853 which is connected to word line 861, the collector 855 of p-n-p serves as the anode of p-n diode 856. The cathode of p-n diode 856 serves as bit line 863. NMOS pull-down 865 sustains the current path through the bit line 863 for nondestructive read. Node 866 is bidirectional signal to read or write data.

Figure 9:
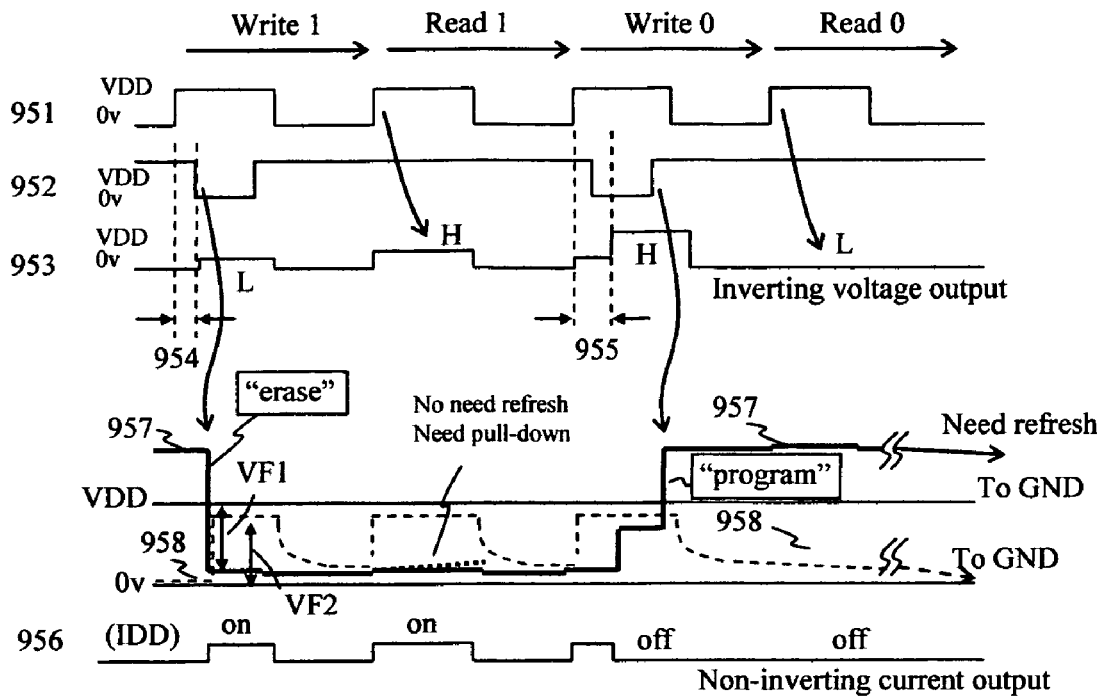
FIG. 9 illustrates write and read timing diagram for the present invention.

Referring now to FIG. 9 in view of FIG. 8, write and read timing are illustrated for the present invention. Word line 951 stays at ground level during standby, and then word line 951 is asserted to activate the memory cell. Word line voltage is determined by the sum of three voltage as shown in FIG. 8, such as built-in voltage 0.6V of p-n diode 856, applied voltage 0.3V of NMOS pull-down 865, emitter-collector voltage 0.1V of p-n-p transistor 852, when the preferred supply voltage of the present invention is 1V~3V range, for example. Word line operation is quite different from that of conventional memory cell, such that word line voltage in the present invention is a result of voltage drop through the current path, while word line voltage in the conventional memory is raised up to supply voltage, because word line has only gate capacitor with no current path. Bit line 953 also stays at ground level during standby. Then bit line 953 determines to store data "0" or data "1". Write operation has a sequence to store data safely. To prepare writing data '1' is to move word line 951 to high level as shown 954 in FIG. 9, and then to lower plate signal 952, while bit line 953 keeps ground level but it will go up slightly by turn-on diode. Then the signal 957 in FIG. 9 which is the storage node becomes forward bias (VF1) from word line 951, and the signal 958 in FIG. 9 which is the anode of diode (856 in FIG. 8) becomes forward bias (VF2) from the ground level. The current flows from word line to bit line, which procedure is called 'erase', because all the cells on the same row will be set to data "1", after then plate returns to high level, however plate rising can not raise storage node 957 because current flow is stronger than coupling. As a result, the storage node keeps forward bias, and p-n-p-n diode is still turned-on. After then, word line is de-asserted to ground level for standby. During standby, leakage helps to keep data "1" because the storage node discharges toward ground level, which makes stronger forward bias, when word line is asserted to high in order to read data. In this sense, data "1" does not need refresh cycle. However, data "1" can be lost when reading data '1', when word line moves up and pulls up bit line while word line is high without pull-down device with multiple read cycles before refresh cycle. To keep data "1", NMOS pull down (865 in FIG. 8) is connected to bit line, which keeps turn-on state, realizes nondestructive read by sustaining current path, and reduces cycle time. However, in DRAM compatible circuit, destructive read is still useful with no pull down device.

Write sequence clears the state of diode before writing to have the same stored level regardless of previous stored level which can be discharged after a long time. This sequence needs to turn-on diode first as shown 954 and 955 in FIG. 9, which is 'erase' operation. After then, bit line 953 goes up to high level and turn-off diode. Plate 952 returns to high level, at the same time the storage node 957 is coupled to higher level than that of supply by raising the plate 952 as shown the third cycle 'write 0s' in FIG. 9, because the storage node 957 is floating when the diode is turned off by raising the bit line 953 to high level. Stored voltage of data "0" is determined by the swing voltage of plate and the capacitance of storage node. After then, storage node 957 will be discharged by reverse bias leakage toward the adjacent nodes which stay at ground level. Capacitor oxide leakage would be ignorable in most applications with thick oxide or low leakage insulator. Signal 958 (855 in FIG. 8) is third terminal which is the anode of diode (856 in FIG. 8). Signal 958 depends on the state of the p-n-p transistor because the third terminal 958 has very small parasitic capacitance and floating, while storage node has more charges to sustain the voltage which is stored data. The inverting voltage output is appeared in the bit line 953 and non-inverting current output 956 is appeared in the bit line. Refresh cycles are periodically asserted to sustain data "0", which operation includes to read voltage from the cell and write inverting voltage to the cell. As shown in FIG. 9, the memory operation is quite different from the conventional DRAM, such that write operation is based on the capacitive coupling or not, by raising plate line, and read operation is based on the diode direction, by detecting the forward-bias or not between the storage node and the word line. Thus the p-n-p-n diode serves as an access device, and also serves as a sense amplifier to detect the storage node and generates binary data "on" or "off". Consequently, the diode-based memory does not require MOS access device and sense amplifier. And it does not require big capacitor because the storage capacitor drives only the base of p-n-p transistor while the diode drives heavy bit line. Furthermore, negative voltage is not required by isolating the inversion of the coupling region from the first terminal and the third terminal. And the diode access device is formed from the various materials such as silicon, germanium, and metal-to-semiconductor (also known as Schottky diode) and so on, as long as punch-through is avoided. Punch-through results from the increased width of the collector-junction transition region with increased collector-junction voltage. In order to avoid punch-through, the width of the base should be longer enough, heavy doping should be used for the junctions, or low voltage is applied between the collector-emitter junctions. Either way can achieve to avoid punch-through, in order to design an efficient diode access device with the existing CMOS process environment. Thus, there is no need of special process or method to form a diode access diode, which means that the existing CMOS process can form the diode access device with only additional steps.

In the present invention, memory array can use single power supply as shown in FIG. 9. This is very useful to configure high density and high speed memory. In some application, plate will swing from ground level to slightly higher voltage than that of word line, which plate pulls up storage node higher to retain data longer. Plate voltage can be internally generated or externally supplied. This is another useful scheme to configure memory array.

Figures 10A, 10B:
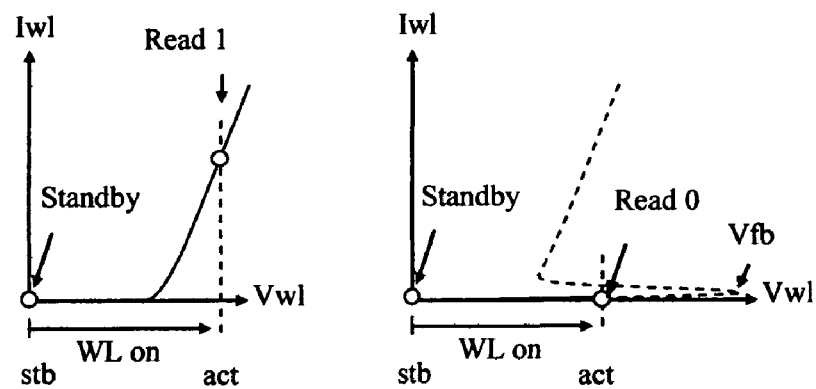
FIG. 10 is current-voltage curve of the present invention for the random access memory.

In FIGS. 10*a* and 10*b*, I–V curves are shown for the present invention. During standby, word line voltage (Vwl) is at ground level which does not make any current except oxide leakage. When reading data '1', word line moves to high level and generates current flow (Iwl) through bit line in FIG. 10*a*. This means that the storage node 752 in FIG.

7 has forward bias from word line. The node 755 in FIG. 7 moves quickly up by the forward biased p-n-p 754 in FIG. 7, where the node 755 is floating and has very low parasitic capacitance. When reading data '0', the storage node 752 in FIG. 7 stays at high level, which makes reverse bias for p-n-p transistor 754 in FIG. 7. Transistor p-n-p 754 can not flow current, and then p-n diode 756 can not flow current either. Voltage output of bit line is ground level, which makes inverting voltage output to bit line. And non-inverting current output (IDD) 956 in FIG. 9 is appeared in the bit line. FIG. 10b illustrates reading-data '0' which has no current, that is, turned-off diode. And forward blocking voltage (Vfb) is illustrated when storing data "0", where forward blocking voltage is determined by the relation of the voltage between the storage node and the word line. As long as the storage node voltage is higher than word line voltage, the forward blocking state is sustained. As a result, the diode is turned off, even if the word line is asserted to high level, which is read "0".

Methods of Fabrication

Replacing MOS access device with a diode access device, the memory cell needs only a p-n-p-n diode (or n-p-n-p diode) and a storage element, which realizes new types of memory cell structure, in order to fabricate on the bulk or SOI (Silicon-on-Insulator) wafer. The steps in the process flow should be compatible with the current CMOS manufacturing environment, which are reported as the prior arts, such as U.S. Pat. Nos. 6,104,045 6,229,161 6,940,761 and 6,943,083. In this respect, there is no need of describing too much detailed process flow to form the memory cell, such as width, length, thickness, temperature, forming method or any other material related data. Instead of describing those details, the present invention focuses on illustrating the new memory cell structures which are more practical and mass producible. In FIG. 11a, one embodiment of a fabrication technique is illustrated to form a memory cell on the bulk for the present invention where word line 1111 is connected to p-type region 1116 through silicide layer 1115 to reduce contact resistance, p-type region 1116 is attached to n-type region 1117, n-type region 1117 is attached to p-type region 1118, p-type region 1118 is attached to n-type region 1119, n-type region 1119 is attached to bit line 1112 through silicide layer 1120. The plate of capacitor 1113 couples to n-type region 1117, which plate 1113 has no coupling region to p-type region 1116 and p-type region 1118. Inversion layer 1114 is isolated from the adjacent nodes, which inversion layer 1114 can be appeared when the voltage of plate 1113 is lower than storage node 1117. With no coupling region, plate can swing from ground level to high level because inversion layer does not make any leakage to adjacent nodes. The oxide layer between plate 1113 and storage node 1117 can have higher dielectric constant than that of control circuit to have more capacitance, and the metal shunting line 1121 is added to connect to plate 1113 repeatedly in the memory array to reduce resistance of polysilicon plate. The memory cell is isolated from the well region 1124 by the isolation layer 1123. The layer 1122 blocks silicide layer. FIG. 11b shows the bit line direction of the memory cell in FIG. 11a, where the cell is formed inside of trench area adding isolation layer 1123 on the bulk. The height of cell is almost same as control circuit. All layer numbers are the same as those of FIG. 11a.

This configuration removes complicated MOS device from the memory cell. As a result, the memory cell has a capacitor and a diode, which is simple to fabricate and analyze as long as reverse bias leakage and oxide leakage are controllable. Another leakage path is so-called back channel effect in the planar structure of wafer. Related references are disclosed, Chen et al, "Characterization of back-channel subthreshold conduction of walled SOI devices", IEEE Transactions on electron Devices, Vol. 38, No. 12, pp 2722, December 1991, and Shin et al, "Leakage current models of thin film silicon-on-insulator devices", Applied Physics Letters, Vol. 72, No. 10, March 1998. This back channel effect is removed as shown in FIG. 12a.

Figures 12A, 12B:
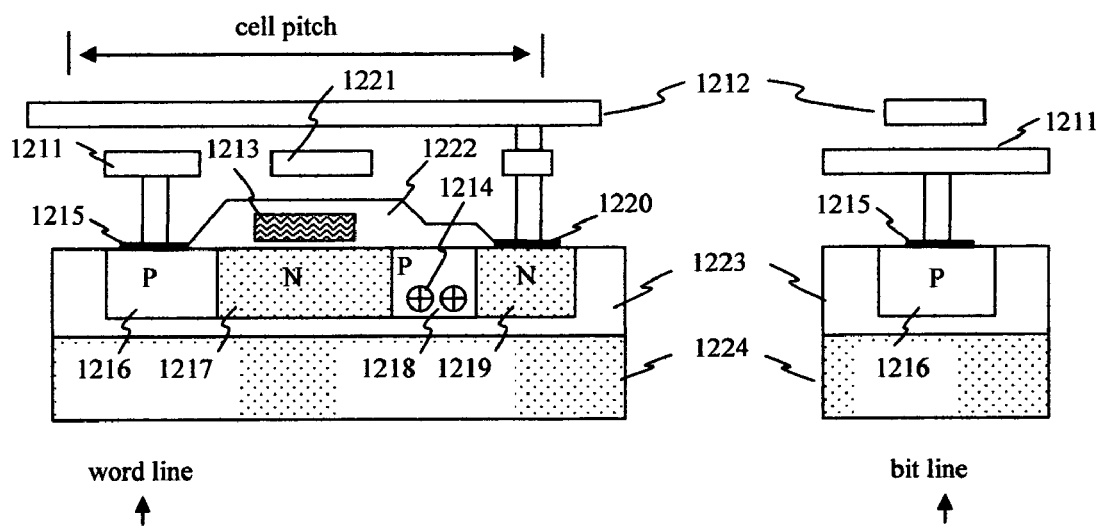
FIGS. 12a and 12b illustrate one embodiment for forming a memory cell on the SOI wafer for the present invention. 12a is shown from the word line direction and 12b is shown from the bit line direction.

FIG. 12a outlines one embodiment of a fabrication technique to remove back channel effect where word line 1211 is connected to p-type region 1216 through silicide layer 1215, p-type region 1216 is attached to n-type region 1217, n-type region 1217 is attached to p-type region 1218, p-type region 1218 is attached to n-type region 1219, n-type region 1219 is attached to bit line 1212 through silicide layer 1220. The plate of capacitor 1213 couples to n-type region 1217, which plate 1213 has no coupling region to p-type region 1216 and p-type region 1218. A parasitic NMOS transistor is formed as the substrate 1224 serves as a gate, p-type region 1218 serves as a body, n-type region 1217 and 1219 serve as a source and a drain, the isolation layer 1223 serves as gate oxide. Additional p-type ions 1214 in the third terminal 1218 are annealed or implanted to remove back channel effect. FIG. 12b is shown from the bit line direction, where p-type region 1216 is isolated from the substrate of SOI wafer. This shows that the memory cell can be implemented on the SOI wafer as well.

Figures 13A, 13B:
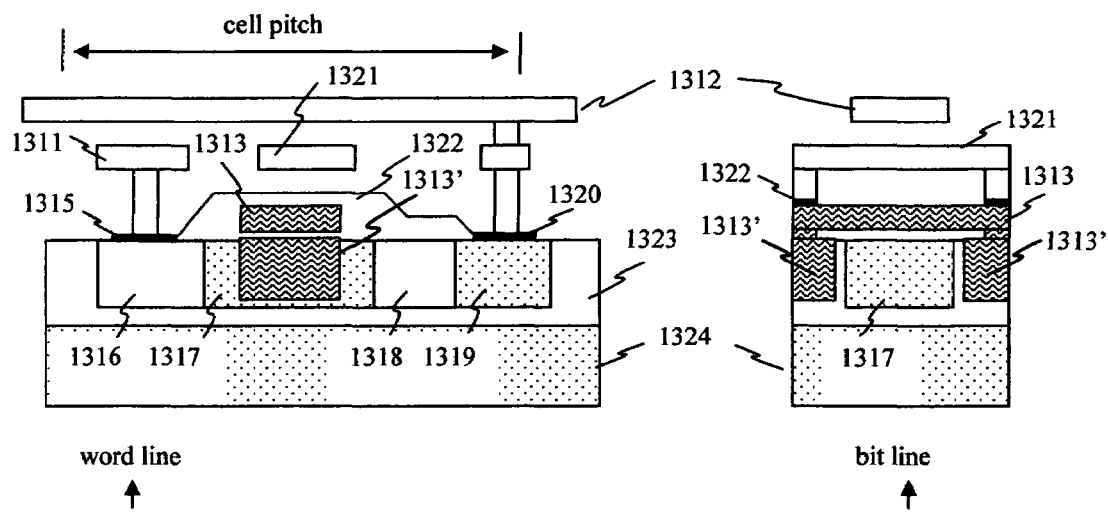
FIGS. 13a and 13b illustrate one embodiment for forming a memory cell with trench capacitor on the wafer for the present invention. 13a is shown from the word line direction and 13b is shown from the bit line direction.

FIG. 13a outlines one embodiment of a fabrication technique to increase storage capacitance of the memory cell, where word line 1311 is connected to p-type region 1316 through silicide layer 1315, p-type region 1316 is attached to n-type region 1317, n-type region 1317 is attached to p-type region 1318, p-type region 1318 is attached to n-type region 1319, n-type region 1319 is attached to bit line 1312 through silicide layer 1320. The plate of capacitor 1313 couples to n-type region 1317, which plate 1313 has no coupling region to p-type region 1316 and p-type region 1318. Plate 1313' couples to the storage node 1317, which plate 1313' is formed inside of trench area. This capacitor is separately formed before forming the plate 1313, the plate of trench capacitor 1313' is connected to plate 1313. FIG. 13b shows the bit line direction of the cell, where the storage node 1317 has three-sided capacitor.

Figure 14:
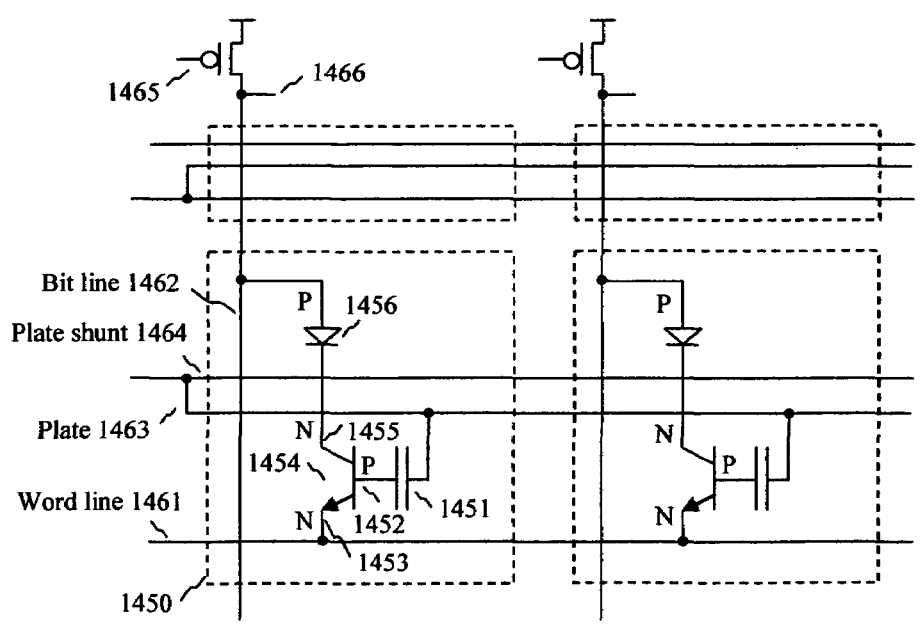
FIG. 14 is the present invention of the random access memory with reverse configuration.

While the description here has been given for configuring the memory circuit and structure, an alternative embodiment would work equally well with reverse connection. In FIG. 14, the word line 1461 is connected to cathode 1453, bit line 1462 is connected to anode of diode 1456, and plate shunt 1464 will be connected repeatedly to the plate 1463 to reduce resistance of the plate. First terminal 1453 is n-type and serves as word line, second terminal 1452 is p-type and serves as storage node, third terminal 1455 is n-type and floating, and fourth terminal 1462 is p-type and serves as bit line. Plate couples to the storage node and plate of capacitor has no coupling region with first, third and fourth region. Trench capacitor or high dielectric constant capacitor can be used for forming capacitor 1451. Substrate bias level would be higher than pre-charge level of word line if substrate is biased. In case of non-biasing substrate, third terminal n-type region 1455 has n-type ion near the isolation region to cut off back channel effect in the planar type structure. PMOS pull-up 1465 can be applied to sustain turn-on state of diode when stored data is "1". Node 1466 is bidirectional signal to write and read data.

Figure 15:
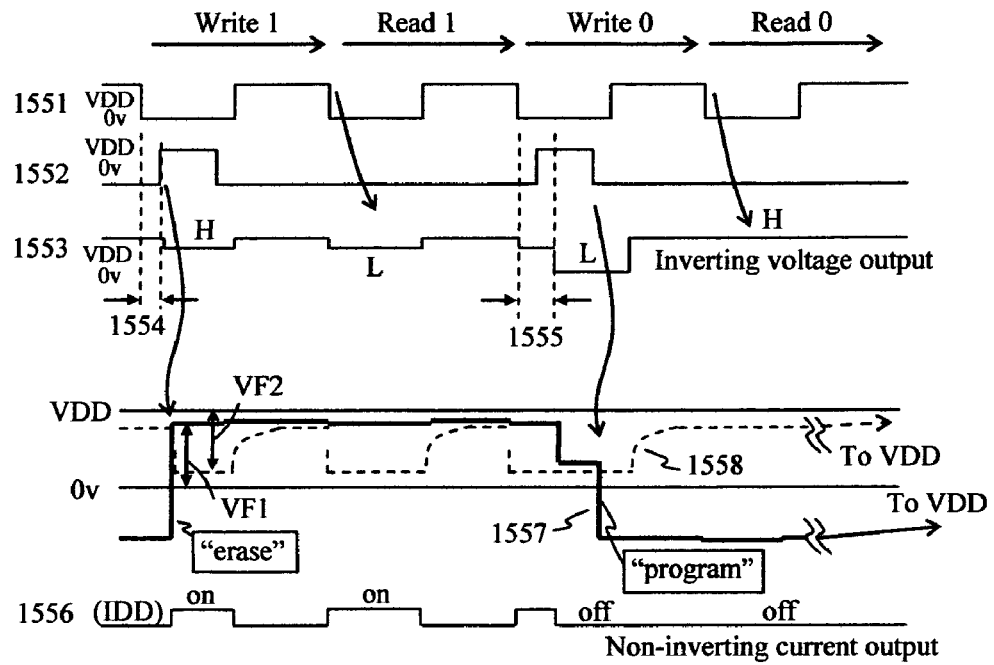
FIG. 15 illustrates write and read timing diagram for the present invention shown in FIG. 14.
Figures 16A, 16B:
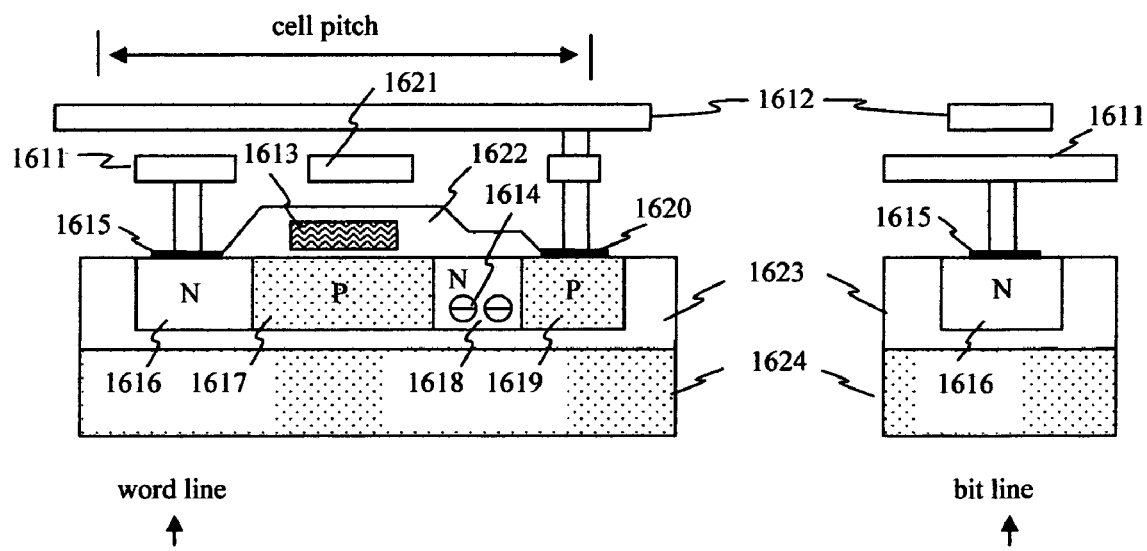
FIGS. 16a and 16b illustrate one embodiment for forming a memory cell for the present invention in FIG. 14. And 16a is shown from the word line direction and 16b is shown from the bit line direction.

In FIG. 15, write and read timings are shown for operating the memory in FIG. 14. Word line 1551 stays at high level during standby, and moves to ground level, when writing or reading. Bit line 1553 also stays at high level during standby. Then bit line 1553 determines to store data "0" or data "1". The signal of plate 1552 stays at ground level during standby, and moves to high level to clear cell and returns to store data. The signal of storage node 1557 has forward bias (VF1) during diode is turn-on, and moves below ground level when stored data is "0", which signal 1557 is raised by leakage current toward high level after writing. It needs refresh cycle periodically. The signal of third terminal 1558 depends on the storage node, which has forward bias voltage (VF2) from high level during diode is turn-on, and moves to high level when stored data is "0". Inverting voltage output in the bit line 1553 is appeared and non-inverting current output 1556 is appeared in the bit line. In FIGS. 16a and 16b, one embodiment for using n-p-n-p diode is illustrated, which outlines one embodiment of a fabrication technique to remove back channel effect, wherein word line 1611 is connected to n-type region 1616 through silicide layer 1615 and contact region, n-type region 1616 is attached to p-type region 1617, p-type region 1617 is attached to n-type region 1618, n-type region 1618 is attached to p-type region 1619, p-type region 1619 is attached to bit line 1612 through silicide layer 1620 and conduction region. The plate of capacitor 1613 couples to p-type region 1617, which plate 1613 has no coupling region to n-type region 1616 and n-type region 1618. A parasitic PMOS transistor is formed as the substrate 1624 serves as a gate, n-type region 1618 serves as a body, p-type region 1617 and 1619 serve as a source and a drain, the isolation layer 1623 serves as gate oxide. Additional n-type ions 1614 in the third terminal 1618 are annealed or implanted to remove back channel effect. FIG. 16b is shown from the bit line direction, where n-type region 1616 is isolated from the substrate of SOI wafer.

CONCLUSION

A high density capacitor memory is realized on the bulk or SOI wafer. Fabrication is compatible with CMOS process with additional steps. Memory cell area is minimized and far less than that of SRAM, and four-terminal diode is used as an access device. There are many embodiments for implementing the memory cells and circuits depending on the applications. The present invention can be applied, such as DRAM, SRAM and cache memory.

Circuit implementation is simpler than that of these days memory having multiple power supply. The present invention has single or dual positive power supply for the memory operation. In some applications, substrate bias can be applied, which is internally generated or externally supplied. However it has very low power consumption because it only compensates leakage current, not switching current, in order to remove back channel effect:

Non destructive read is realized adding pull-down device to bit line, which makes cycle time fast. And a write sequence makes stable write operation.

It is to be understood that the above description is intended to be illustrative, and not restrictive. Many other embodiments will be apparent to those of skill in the art upon reviewing the above description. Therefore the scope of the invention should be determined with reference to the appended claims, along with the full scope of equivalents to which such claims are entitled.

What is claimed is:

1. A random access memory, comprising:
    memory cell, wherein a capacitor stores data and a diode controls to store data "1" (on) or "0" (off); and the diode, wherein includes four terminals, the first terminal is p-type and serves as a word line, the second terminal is n-type and serves as a storage node, the third terminal is p-type and floating, and the fourth terminal is n-type and serves as a bit line; and plate of capacitor couples to the second terminal, which plate has no coupling region to first, third and fourth terminal; and the diode is planar type which is horizontally formed on the surface of the wafer; capacitor is formed on the second terminal of the diode by adding insulator between the second terminal and the plate, thus the height of the memory cell is almost same as that of MOS transistor in the chip; and
    pull-down transistor, wherein is connected to the fourth terminal of the diode through the bit line, and the pull-down transistor sustains the current path from the word line through the diode when the storage node voltage is lower than the word line voltage minus built-in voltage of the diode, which establishes the forward bias from the word line (first terminal) to the storage node (second terminal) by asserting the word line, thus the forward bias turns on the diode and sets up the current path from the word line to the pull-down transistor, as a result the diode generates a current flow, which is data "1" as a current output, and when the storage node voltage is higher than the word line voltage, the forward bias is not established from the word line to the storage node, as a result the diode does not generate a current flow through the pull-down transistor, which is data "0" with no current output.

2. The random access memory of claim 1, wherein the insulator of the capacitor includes higher dielectric constant than that of control circuit in the chip.

3. The random access memory of claim 1, wherein the diode is formed from silicon diode.

4. The random access memory of claim 1, wherein is the diode formed from compound semiconductor.

5. The random access memory of claim 1, wherein is the diode formed from germanium.

6. The random access memory of claim 1, wherein can be implemented an alternative embodiment with reverse configuration; and the diode, wherein includes four terminals, the first terminal is n-type and serves as a word line, the second terminal is p-type and serves as a storage node, the third terminal is n-type and floating, and the fourth terminal is p-type and serves as a bit line; plate of capacitor couples the second terminal, which plate has no coupling region to first, third and fourth terminal; and pull-up transistor is connected to the fourth terminal of the diode through the bit line.

* * * * *